United States Patent [19]

Walsworth et al.

[11] Patent Number: 5,144,252
[45] Date of Patent: Sep. 1, 1992

[54] METHOD AND APPARATUS FOR TRANSDUCER MEASUREMENTS ON A METALLIC PAIR

[75] Inventors: Richard L. Walsworth, Pittsford; Edward K. Siu, Rochester, both of N.Y.

[73] Assignee: Harris Corporation, Melbourne, Fla.

[21] Appl. No.: 619,931

[22] Filed: Nov. 27, 1990

[51] Int. Cl.5 .............................................. H04B 3/46
[52] U.S. Cl. ...................................... 324/713; 379/26; 340/870.38
[58] Field of Search ........................ 324/705, 706, 713; 379/106, 42, 4329, 30, 26; 340/870.38

[56] References Cited

U.S. PATENT DOCUMENTS

| | | | |
|---|---|---|---|
| 3,922,490 | 11/1975 | Pettis | 340/870.38 |
| 4,025,736 | 3/1977 | Chlupsa | 340/870.38 |
| 4,041,382 | 8/1977 | Washburn | 324/705 |
| 4,399,333 | 8/1983 | Gewitz et al. | 379/26 |
| 4,728,881 | 3/1988 | Evans et al. | 324/705 |
| 4,852,145 | 7/1989 | Bevers et al. | 379/30 |
| 5,073,920 | 12/1991 | Masukawa et al. | 379/30 |

FOREIGN PATENT DOCUMENTS

| | | | |
|---|---|---|---|
| 24942 | 3/1981 | European Pat. Off. | 379/30 |
| 1292 | 1/1988 | Japan | 379/30 |

Primary Examiner—Jack B. Harvey
Assistant Examiner—Maura K. Regan
Attorney, Agent, or Firm—Evenson, Wands, Edwards, Lenahan & McKeown

[57] ABSTRACT

A method and arrangement for measuring the resistance of a transducer which is coupled across a pair of conductors that are each coupled through separate sets of blocking diodes to a line card, these conductors possibly carrying a variable voltage. In the method and arrangement, a voltage of a first one of the conductors to ground is iteratively measured. This voltage from the first conductor to ground is tracked such that current flow is allowed through only one of the sets of blocking diodes. A value of the resistance of the transducer can then be accurately determined from the iteratively measured voltage values, since the variable voltage is taken into account by the tracking of the voltage from the first conductor to ground.

20 Claims, 2 Drawing Sheets

BLOCKING DIODE V-I CURVE

BLOCKING DIODE WITH LINE CARD GTD-5A CIRCUIT AND TRANSDUCER, $R_T$

METHOD AND APPARATUS FOR TRANSDUCER MEASUREMENTS ON A METALLIC PAIR

FIELD OF THE INVENTION

The present to alarm systems, and more specifically, to the measurement of transducers that are coupled across tip and ring conductors which provide dual access to a subscriber's telephone and to the transducers.

BACKGROUND OF THE INVENTION

Remote alarm reporting systems are known in which the monitoring and intelligence of the system is located in a central location, remote from the area that is monitored. Sensor inputs located in the monitored area can be coupled to the monitor via telephone lines, for example. These sensors can be transducers which measure pressure, temperature, etc. The transducers are pneumatic or cathodic, and are always resistive.

The transducers are located at the monitored area across the tip and ring conductors of a subscriber's telephone lines. The transducers are connected to what is known as a "line card", such as a GTD 5A line card (manufactured by GTE), through a combination of blocking diodes. The intelligence of the system, which can be microprocessor based for example, monitors the condition of the transducers and will respond to alarm conditions sensed by the transducers by dialing a pre-configured telephone number.

The measurement of the resistance of some transducers is made difficult by the fact that the transducer is always powered by a special line card such as the GTD 5A line card through the blocking diodes. This is known as a "wet" measurement, since there is voltage on the lines. This measuring is made even more difficult since the GTD 5A line card contains a symmetric, but variable voltage on the tip and ring conductors. In addition, this variable voltage varies with the load on the transducer, cable shorts and the subscriber's phone off-hook across the tip and ring.

A device is known which will make wet measurements. It does so by placing pre-set voltages on the tip and ring conductors so that there is no current flow through the blocking diodes. For example, assume that the conductor at the line card that is connected to the tip conductor is at 0 volts, and the conductor at this line card that is connected to the ring conductor is at $(-)48$ volts. The known device will make a wet measurement by first placing an equal voltage of 0 volts on the tip conductor on the other side of the blocking diodes, between the blocking diodes and the transducers. Since the known device places a preset voltage on the tip conductor, it does not account for the variable voltage (a bias voltage) that the GTD 5A line card contains. This bias voltage varies from line card to line card, and also in dependence on the load. The bias voltage ranges from, for example, $(-)2$ to $(-)6$ volts. This failure to account for the bias voltage due to different line cards and the load leads to inaccurate wet measurements of the resistance of the transducers.

There is a need for a method and apparatus for making measurements of transducers that are coupled by a metallic pair to a line card, which accounts for variable bias voltages, to produce an accurate wet measurement.

SUMMARY OF THE INVENTION

This and other needs are met by the present invention which provides a method and arrangement for measuring the resistance of a transducer which is coupled across a pair of conductors that are each coupled through separate sets of blocking diodes to a line card, these conductors possibly carrying a variable voltage. In the method and arrangement, a voltage of a first one of the conductors to ground is iteratively measured. This voltage from the first conductor to ground is tracked such that current flow is allowed through only one of the sets of blocking diodes, for example, on the side of the ring conductor. A value of the resistance of the transducer can then be accurately determined from the iteratively measured voltage values, since the variable voltage is taken into account by the tracking of the voltage from the first conductor to ground.

The present invention allows accurate "wet" measurements, as well as dry measurements of the transducer resistance to be made, even though the voltage on the conductors is variable due to differences from line card to line card as well as the loading of the transducer, cable shorts and the subscriber's phone being offhook across the tip and ring conductors. The present invention also has the advantages of rejecting AC power fundamentals and detecting ringing voltage to guard against invalid measurement determinations.

Other objects, advantages and novel features of the present invention will become apparent from the following detailed description of the invention when considered in conjunction with the accompanying drawings.

DETAILED DESCRIPTION OF THE DRAWINGS

Figure 1:
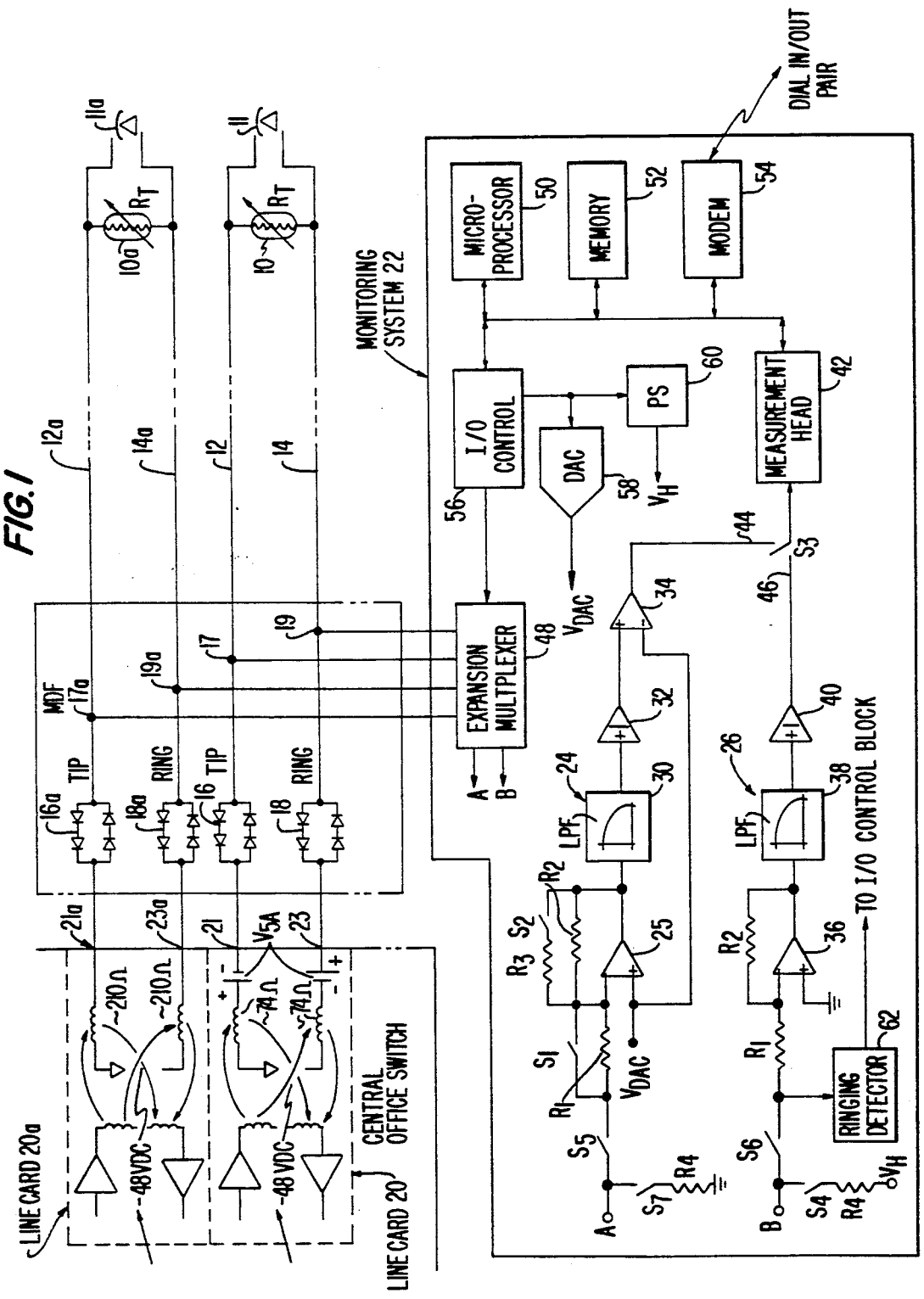
FIG. 1 is a schematic illustration of a device to measure the resistance of a transducer constructed in accordance with an embodiment of the present invention.

FIG. 1 illustrates schematically a device constructed according to an embodiment of the present invention that will perform wet measurements of transducers. Each transducer 10 is coupled across a tip conductor 12 and a ring conductor 14 of a tip-ring conductor pair leading to a subscriber telephone 11. The transducers 10 can be pneumatic or cathodic, for example, and are always resistive. The transducers 10 can have a range of, for example, 100 K$\Omega$ to 4 M$\Omega$.

The tip conductor 12 is coupled through a set of blocking diodes 16 to a first output 21 of a line card 20. The ring conductor 14 is coupled to a second output 23 of the line card 20 through a separate set of blocking diodes 18. The blocking diodes 16, 18 for a number of tip-ring conductor pairs are arranged in a main distribution frame (MDF) 13.

The line card 20 can be a 3A line card or a 5A line card, such as that manufactured by GTE. Another example of a line card is an AXE-10 manufactured by Ericsson. (The elements coupled to the 3A line card have a suffix "a" attached to their reference numerals, to distinguish the elements that are coupled to the 5A line card.) As can be seen in FIG. 1, if the 3A line card is attached the first output 21a is substantially at 0 volts, while the second output 23a is substantially at (−)48 volts. In order to take a wet measurement of the transducer 10a, it is necessary to provide a voltage of 0 volts at point 17a on the tip conductor 12a. This is done to prevent current flow through the group of blocking diodes 16a, so as to obtain an accurate measurement. The problem with this approach if used on a 5A line card is that it does not take into account the fact that the voltage at the outputs 21,23 of the line card 20 will vary, from line card to line card and from variation in loading. This variable voltage (the bias voltage) can be between (−)2 to (−)6 volts, for example. The bias voltage is symbolized in FIG. 1 and following equations as $V_{5A}$.

The present invention provides a much more accurate wet measurement of the transducer 10 since it takes into account the bias voltage $V_{5A}$ (The present invention also makes accurate measurements of the transducer 10 across tip and ring in a dry application, that is without a line card connected.) The voltage on the tip conductor 12 is tracked, and voltage provided on this conductor so that current will flow only through blocking diodes 18. This allows the current flow through the transducer 10 to be accurately measured.

A monitoring system 22, which can report alarms when monitored conditions indicate an alarm should be triggered, is coupled to the tip and ring conductors 12 and 14 through a multiplexing device 48. There are two separate branches which provide measurements of two different voltages, through which a measurement of the resistance of the transducer 10 can be determined The first branch 24 provides an output $V_A$ at point 44, which represents the voltage on the tip conductor 12. The second branch 26 provides an output $V_B$ at point 46, which represents the voltage on the ring conductor 14.

The first branch 24, coupled to the tip conductor 12, has a number of resistors $R_1$-$R_3$ arranged as shown in FIG. 1. There are also controllable switches $S_1$, $S_2$ and $S_5$, the operation of which will be described later. Switch $S_5$, from the multiplexing device 48, leads to one end of the resistor $R_1$, which is coupled at its other end to the parallel coupling of resistors $R_2$ and $R_3$. The resistor $R_1$ is also coupled to the negative input of an operational amplifier 28. The output of the operational amplifier 28 is coupled to one end of the parallel coupling of resistors $R_2$ and $R_3$. The positive input of the operational amplifier 28 is programmable by a digital-to-analog converter 58 with a voltage $V_{DAC}$ representative of the voltage at the tip conductor 12.

The output of the operational amplifier 28 is coupled to the input of a low pass filter 30. The output of the low pass filter 30 is coupled to the input of an amplifier 32, with the output of this amplifier 32 being coupled to the positive input of another operational amplifier 34. The negative input of the operational amplifier 34 receives the voltage $V_{DAC}$. The output of the operational amplifier 34 is the voltage $V_A$, which can be provided through switch $S_3$ to a measurement head 42.

The first branch 24, when $R_1$ is shunted by switch $S_1$, operates to convert the current into node 17 into a voltage through the combination of operational amplifier 28 and resistors $R_2$ and $R_3$. This voltage is then processed by rejecting AC power fundamentals through low pass filter 30. The remaining DC voltage component is buffered by the unity-gain amplifier 32 which has low output impedance. This DC voltage component is prepared for a true-difference operational amplifier 34. However, the conversion from current to voltage is referenced to $V_{DAC}$ which also appears at tip conductor 12. If $V_{DAC}$ is now presented to the inverting input of the true-difference operational amplifier 34, hence a true current-to-voltage conversion with AC rejection has been obtained through node 17. Switch $S_2$ serves as a gain control in converting current to voltage. This branch then provides an accurate $V_A$ at the output of amplifier 34 to the measurement head 42. (If resistor $R_1$ is not shunted and $V_{DAC}$ is programmed to 0 volts, branch 24 becomes a voltage-to-voltage converter with AC rejection).

The second branch 26 includes a switch $S_6$ that is coupled to the ring conductor 14 through the multiplexing device 48, and also to one end of a resistor $R_1$. (The same designation of the resistors $R_1$ and $R_2$ in the first and second branches 24, 26 indicate that the resistances of these resistors are the same in the respective branches.) The resistor $R_1$ is coupled to the negative input of an operational amplifier 36. The resistor $R_2$ has one end also coupled to the negative input of the operational amplifier 36 and another end coupled to its output. The positive input of the operational amplifier 36 is coupled to ground.

The output of the operational amplifier 36 is coupled to the input of a low pass filter 38, whose output is coupled to the input of an amplifier 40. The output of the amplifier 40 is $V_B$, which can be provided through the switch $S_3$ to the measurement head 42.

The second branch 26 converts the voltage at node 19 to another voltage at the output of operational amplifier 36 in combination with resistors $R_1$ and $R_2$. This voltage is processed by rejecting AC power fundamentals through low pass filter 38. The remaining DC voltage component is buffered by the unity-gain amplifier 40 with low output impedance. This provides an accurate representation $V_B$ of the DC voltage present at node 19. $V_B$ can be provided through switch $S_3$ to the measurement head 42.

The ring conductor 14 can be coupled to a programmable voltage $V_H$ through a switch $S_4$ and a resistance $R_4$.

In operation, it is determined if the tip-ring pair (tip conductor 12 and ring conductor 14) is busy. This is performed by only closing switches $S_5$ and $S_6$ and measuring the tip to ground voltage $V_A$ and the ring to ground voltage $V_B$. If the tip-ring pair is not busy, switch $S_7$ is closed, with resistor $R_4$ connected through ground and the voltage $V_{DAC}$ programmed at 0.0 volts. The resistor $R_4$ is forced to 1 KΩ and $V_A$ is measured at point 44 by the measurement head 42. This generates a starting voltage $V_{START}$, which is used to find the resistance $R_T$ of the transducer 10 in an iterative search process. An initial prediction for $V_{START}$ is necessary since the line card 20 has a variable bias voltage $V_{5A}$ which ranges from (−)2 to (−)6 volts.

The starting voltage $V_{START}$ is determined according to the equation:

$$V_{START} = -(R_1/R_2)(1+R_{5A}/R_4)V_A - 0.7 \qquad \text{(Eq. 1)}$$

It is reasonable to assume that $V_{START}$ will not be greater than (−)1.5 volts. At this point, however, the voltage $V_{DAC}$ is programmed with the value determined for $V_{START}$. The switch $S_7$ is opened and switch $S_1$ is closed until the iterative process is terminated.

The voltage $V_A$ is measured at the measurement head 42. The voltage $V_{DAC}$ is then decremented by a value, 0.5 volts for example. The voltage $V_A$ is then measured again. If the old and new voltages $V_A$ are less than 0.1 volts apart, the voltage $V_{DAC}$ is decremented by 0.1 volts. Otherwise, the voltage is decremented by 0.5 volts. In either case, the voltage $V_A$ is measured again. This procedure is repeated until ten successive voltages $V_A$ with a maximum of 0.1 volt separations are found or until other measurement restrictions are met. Thus, the stored number of points N has a range of $0 \leq N \leq 10$.

Figure 2:
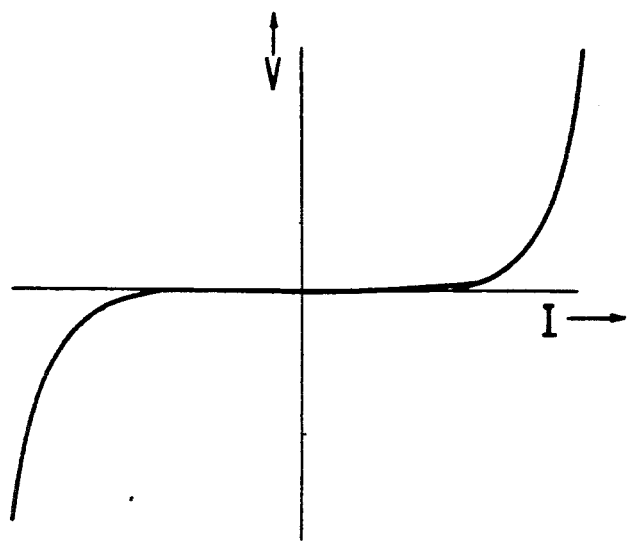
FIG. 2 illustrates a voltage-current curve for blocking diodes without taking into account the effect of a line card or a transducer coupled to the blocking diodes.
Figure 3:
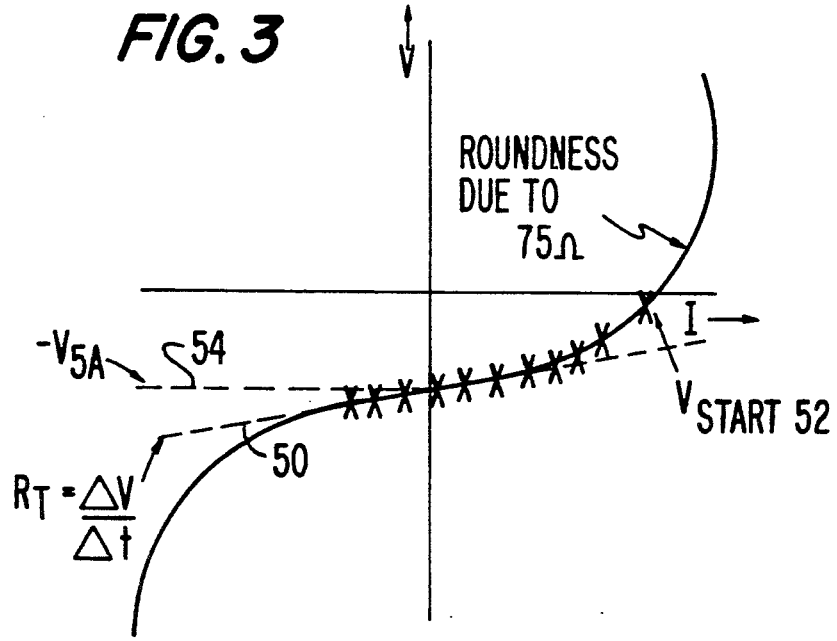
FIG. 3 shows a curve for the blocking diodes similar to FIG. 2, but which takes into account the effect of a line card and a transducer coupled to the blocking diodes.

An averaging technique is now used to find a cluster of points that represent the transducer resistance $R_T$. FIG. 2 illustrates a voltage-current curve for the blocking diodes 16 and 18, while FIG. 3 shows a similar curve for the blocking diodes 16, 18, but with the line card 20 and the transducer 10 coupled to the blocking diodes 16, 18. The transducer resistance $R_T$ is represented by a tangent slope 50 from a cluster of points, as shown in FIG. 3. Point 52 represents the value of while the bias voltage $(-)V_{5A}$ is shown as dashed line 54.

The transducer resistance is calculated for each point according to the equation:

$$R_T = -R_2(V_{RG} - V_{DAC})/V_A \quad \text{(Eq 2)}$$

With Equation 2, where $V_{RG} = V_B$, an overall average for the transducer resistance $R_T$ is calculated according to the equation:

$$R_{T(AVG)} = \left( \sum_{i=1}^{N} R_{Ti} \right) / N \text{ if } N \geq 1 \quad \text{(Eq. 3)}$$

For each point, the error $E_i$ is calculated from the average transducer resistance $R_{T(AVG)}$ according to the equation:

$$E_i = (R_{T(AVG)} - R_{Ti})/R_{T(AVG)} \times 100\% \quad \text{(Eq. 4)}$$

The resistance value $R_{Ti}$ that has the greatest associated error $E_i$ is selected. If the associated error $E_i$ is less than 5%, then $R_{T(AVG)}$ is considered to be the true transducer resistance $R_T$. If, however, the associated $E_i$ is greater than or equal to 5%, then this resistance value $R_{Ti}$ is rejected. The number of stored points N now becomes equal to $(N-1)$. Equations 3 and 4 are repeated for the remaining $R_{Ti}$'s stored.

The above procedure is repeated until either one stored point remains or the true transducer resistance $R_T$ is found.

The procedure followed above can be further refined by the addition of certain restrictions. For example, at least three points can be required for a valid $R_{T(AVG)}$. The process may terminate early upon any of the following conditions:

a) if the voltage $V_A$ is ever less than 0.0 volts;
b) if ringing occurs through detector 62;
c) if $V_{DAC}$ than 2.0 volts from $V_{START}$;
d) if successive up-range pegging occurs.

Individual points may be rejected early if an associated voltage $V_A$ is greater than 10 volts. The set of measured points is flagged as an error if there are two or less valid points, and there is no ringing and no shorts.

The microprocessor 50 is the controller responsible for monitoring transducers 10 and reporting the status through modem 54. This microprocessor 50 executes all monitoring, measuring, procedures, etc. The microprocessor 50 executes the above activities based on programs stored in memory 52. This memory 52 also provides temporary storage for the $V_A$'s accepted as elaborated in the measurement procedure discussed above. The microprocessor 50 controls all input or output devices through an I/O control 56:

1) acquires digital values from measurement head 42 that represent voltages $V_A$, $V_B$, etc.;
2) controls a digital-to-analog converter (DAC) 58 which generates $V_{DAC}$ a programmable source (PS) 60 which generates $V_H$;
3) reads the ringing detector 62;
4) controls the modem 54 for dialing in or out and sending or receiving data;
5) controls all switches $S_1$, through $S_7$, and all programmable resistors $R_4$ (one is connected to switch $S_4$ and the other is connected to switch $S_7$);

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. An arrangement for measuring the resistance of a transducer which is coupled across a pair of conductors that are each coupled through separate sets of blocking diodes to a line card, said conductors carrying a variable voltage, comprising:

means for iteratively measuring a voltage of a first one of the conductors to ground;

means for tracking said voltage from the first conductor to ground such that current flow is allowed through only one of said sets of blocking diodes; and means for determining from the iteratively measured voltages a value of the resistance of the transducer.

2. The arrangement of claim 1, wherein the means for determining includes means for storing a number of measured voltage values.

3. The arrangement of claim 2, wherein the means for determining further includes means for calculating for each stored measured voltage value an associated transducer resistance value.

4. The arrangement of claim 3, wherein the means for determining further includes means for averaging the associated transducer resistance values to produce an average transducer resistance value.

5. The arrangement of claim 4, wherein the means for determining further includes means for calculating an error value for each associated transducer resistance value.

6. The arrangement of claim 5, wherein the means for determining further includes means for selecting an associated transducer resistance value that has a highest error value, said associated transducer resistance value that has a highest error value being the value of the resistance of the transducer if the highest error value is below a threshold value.

7. The arrangement of claim 6, wherein the means for determining further includes means for rejecting the associated transducer resistance value that has a highest error value if that highest error value is greater than or equal to the threshold value, re-averaging the remaining associated transducer resistance values to produce a new average transducer resistance value, calculating a new error value for each of the remaining associated transducer resistance values, and selecting a remaining associated transducer resistance value that has a new highest error value, said associated transducer resistance value that has a new highest error value being the value of the resistance of the transducer if the new highest error value is below a threshold value.

8. The arrangement of claim 1, wherein the means for iteratively measuring a voltage and the means for tracking said voltage includes a first branch coupled to a first one of said conductors, said first branch including a first resistive network coupled to the first conductor and a first operational amplifier having a first input coupled to the first conductor and the first resistive network, and a second input coupled to receive an estimated value of the voltage of the first conductor to ground, and an output.

9. The arrangement of claim 8, wherein the first branch further includes a first low pass filter having an output and an input that is coupled to the output of the first operational amplifier, and a first amplifier having an input coupled to the output of the first low pass filter and which has an output, and a second operational amplifier having an output, a first input coupled to the output of the first amplifier and a second input coupled to receive the estimated value of the voltage.

10. The arrangement of claim 9, wherein the first branch further includes a measurement head switchably coupled to the output of the second operational amplifier.

11. The arrangement of claim 10, wherein the means for iteratively measuring a voltage and the means for tracking said voltage further includes a second branch coupled to a second one of said conductors, said second branch including a second resistive network coupled to the second conductor and a third operational amplifier having a first input coupled to the second conductor and the second resistive network, and a second input coupled to ground, and an output.

12. The arrangement of claim 11, wherein the second branch further includes a second low pass filter having an output and an input that is coupled to the output of the third operational amplifier, and a second amplifier having an input coupled to the output of the second low pass filter and which has an output.

13. The arrangement of claim 12, wherein &he output of the second low pass filter is switchably coupled to the measurement head.

14. A method of measuring the resistance of a transducer which is coupled across a pair of conductors that are each coupled through separate sets of blocking diodes to a line card, said conductors carrying a variable voltage, comprising:
 iteratively measuring a voltage of a first one of the conductors to ground;
 tracking said voltage from the first conductor to ground such that current flow is allowed through only one of said sets of blocking diodes; and
 determining from the iteratively measured voltages a value of the resistance of the transducer.

15. The method of claim 14, wherein the step of determining includes the step of storing a number of measured voltage values.

16. The method of claim 15, wherein the step of determining further includes the step of calculating for each stored measured voltage value an associated transducer resistance value.

17. The method of claim 16, wherein the step of determining further includes the step of averaging the associated transducer resistance values to produce an average transducer resistance value.

18. The method of claim 17, wherein the step of determining further includes the step of calculating an error value for each associated transducer resistance value.

19. The method of claim 5, wherein the step of determining further includes the step of selecting an associated transducer resistance value that has a highest error value, said associated transducer resistance value that has a highest error value being the value of the resistance of the transducer if the highest error value is below a threshold value.

20. The arrangement of claim 19, wherein the step of determining further includes the steps of: rejecting the associated transducer resistance value that has a highest error value if that highest error value is greater than or equal to the threshold value; re-averaging the remaining associated transducer resistance values to produce a new average transducer resistance value; calculating a new error value for each of the remaining associated transducer resistance values; and selecting a remaining associated transducer resistance value that has a new highest error value, said associated transducer resistance value that has a new highest error value being the value of the resistance of the transducer if the new highest error value is below a threshold value.

* * * * *